United States Patent [19]

Konstantinov et al.

[11] Patent Number: 4,458,008

[45] Date of Patent: Jul. 3, 1984

[54] PHOTOGRAPHIC SYSTEM AND PHOTOGRAPHIC MATERIAL FOR USE THEREIN

[75] Inventors: Ivan T. Konstantinov; Borislav D. Mednikarov; Maria A. Sahatchieva; Atenas T. Burov, all of Sofia, Bulgaria

[73] Assignee: Zlafop pri Ban, Sofia, Bulgaria

[21] Appl. No.: 452,934

[22] Filed: Dec. 27, 1982

Related U.S. Application Data

[62] Division of Ser. No. 240,988, Mar. 5, 1981, abandoned.

[30] Foreign Application Priority Data

Feb. 15, 1980 [BG] Bulgaria ..................... 46640

[51] Int. Cl.$^3$ ................. G03C 1/495; G03C 1/72; G03F 7/10
[52] U.S. Cl. ........................... 430/302; 430/270; 430/275; 430/277; 430/278; 430/318; 430/326; 430/331
[58] Field of Search ............... 430/270, 302, 325, 326, 430/331, 495, 318

[56] References Cited

U.S. PATENT DOCUMENTS 3,762,325 10/1973 Hallman et al. ..................... 430/306

4,198,237 4/1980 Nahara et al. ..................... 430/495

*Primary Examiner*—Richard L. Schilling

*Attorney, Agent, or Firm*—Murray, Whisenhunt and Ferguson

[57] ABSTRACT

Photolithographic methods for the production for example of microelectronic circuits and sensitizing and printing elements in offset printing forms show marked improvement in sensitivity, non-critical outline development and good shelf-life as well as high resolving power and good adhesion of photosensitive coatings to a carrier base while remaining sensitive to exposure from a wide variety of radiation sources, by incorporating in or on a chalcogenide photosensitive layer, one or more materials selected from dyestuffs having the capacity for dyeing tanned cotton, dyestuffs having the capacity for dyeing synthetic fibres, compounds capable of acting as accelerators, antioxidants or age resistors in the vulcanization of elastomers and developing agents effective in the development of silver halide-based photographic materials. Many of the aforesaid advantages are also achieved if the dyestuff(s) is incorporated in an alkaline developing agent of the usual type.

14 Claims, No Drawings

PHOTOGRAPHIC SYSTEM AND PHOTOGRAPHIC MATERIAL FOR USE THEREIN

This is a divisional application of Ser. No. 240,988, filed Mar. 5, 1981, now abandoned.

This invention relates to a process for the production of a photographic material for use in photolithography for example in the production of microelectronic circuits and the production of sensitizing and printing elements in offset printing plates.

As used herein, a photographic system denotes a combination of materials to be used together, namely a combination of a photographic material comprising a photosensitive layer of the type to be described herein and an alkaline developing agent to be used on the photosensitive layer after exposure thereof to radiation, to obtain a visible photographic image.

It is known that some inorganic photosensitive substances, such as arsenous sulphide undergo changes in some of their physical and chemical properties after exposure to radiation of various types. If only partial or imagewise exposure to radiation of such substances takes place, it has been found that the change in chemical properties on irradiation includes an increase in the rate of dissolution in certain solvents in those areas of the photosensitive substance which have been irradiated as compared to the non-irradiated areas. The solvents generally employed are alkaline solutions. These inorganic photosensitive substances are nevertheless stable to some chemical reagents, for example acids, thereby enabling acid to be employed to etch out metal exposed on dissolution of exposed photosensitive substance leaving a metal image corresponding to the subject originally photographed on removal of the residual, undissolved photosensitive layer. Such a procedure for use of the photographic material of the aforementioned type in the production of photoresist materials, for example for use in the production of microelectronic printed circuits is described by Nogai. H, Yoshikawa. A, Toyoshim. Y, Ochi. O and Mizushima. Y in Applied Physics Letters 28, 145 (1976) and in Applied Physics Letters 29, 677 (1976). The capacity for inking of the materials resulting from dissolution of imagewise exposed photosensitive material renders them suitable, in principle, for use in the production of offset printing plates (U.S. Pat. No. 3,762,325). Notwithstanding the advantages given in the first two aforementioned references of such a photographic system for use in the production of photoresist material, as compared to the previously widely used photolacquers, namely exceptionally high resolution, the possibility of depositing the photosensitive layer on a substrate by evaporation in a vacuum, thereby achieving excellent uniformity and impurity-free preparation conditions, very good adhesion, thereby allowing the more intricate processes of etching of the substrate or an intermediate layer to be carried out successfully, nevertheless such photographic materials have not hitherto found practical application. The main reason for this is the low ratio between the rates of dissolution of imagewise exposed and unexposed photosensitive substance in the presence of the usual alkaline solutions employed for such purpose. This ratio may be termed photoselectivity of dissolution. This ratio increases on increasing the extent of exposure, but even when exposure is at the maximum practical, the alkaline development procedure does not provide sufficient photoselectivity of dissolution. Moreover, the photographic material is generally insufficiently sensitive to the comparatively high exposure required to achieve the maximum photoselectivity of dissolution.

Hence the following two disadvantages of the aforementioned type of photographic system may be identified:

1. Low sensitivity in comparison to organic photolacquers hitherto used.

2. Very poor tolerance during the duration of the alkaline development, i.e. development to the critical extent is difficult to achieve.

The critical character of the alkaline development results from the low photoselectivity of dissolution which results, on complete removal of exposed inorganic photosensitive substance, in unexposed areas being affected to some extent depend upon the amount of exposure and on the activity of the alkaline developer as a solvent for the photosensitive substance, the pH of the developer being of particular importance here. Because of the way in which the two aforementioned disadvantages are inter-related, there has not hitherto been described any photographic system which simultaneously solves both problems.

Experiments carried out by the inventors have revealed two further disadvantages in such photographic systems. The first is the appearance of pinholes in the photosensitive layer after alkaline development and treatment with an acid etching solution, for example an acid ceric ion-containing solution for chromium. The second disadvantage is the increase in the number and size of these pinholes which takes place when these photographic materials undergo storage over a period of time before processing. This ageing process makes the photographic materials unusable as photoresists after a certain storage time, or even immediately after their production when particularly high standards are placed on the photoresists, as for example in the production of microelectronic printed circuits. Bearing in mind the characteristic advantages of a photographic system of the aforementioned type, it will therefore be appreciated how the overcoming of the aforementioned disadvantages would yield a product capable of wide application in photolithographic processes.

It is an object of this invention to provide a photographic procedure of the aforementioned type using a photographic material comprising a photosensitive substance and an alkaline developer to be used thereon after imagewise exposure, which enables good photoselectivity of dissolution to be obtained after exposure to radiation.

It is a further object of the invention to provide a process for the production of a developed photographic material which is stable on storage and which because of the photoselectivity of dissolution on development provides high photographic sensitivity, thereby enabling use of the developed photographic material for photolithographic purposes.

According to the present invention, there is provided a process for the production of a photographic material for use in photolithography, which comprises exposing imagewise to radiation a material which comprises a carrier base and, on the carrier base, a thin homogeneous or emulsion layer of at least one photosensitive substance selected from chalcogenides of phosphorus, arsenic, germanium and metals, which photosensitive substance is capable, upon exposure to radiation, of exhibiting photoselective capacity for dissolution in an alkaline developer, the photosensitive substance being either unreactive with the carrier base when exposed to radiation or reactive with the carrier base when exposed to radiation and isolated from the carrier base by interposition between the said layer and the carrier base of an intermediate layer having adhesive and/or insulating and/or hydrophilic properties and which does not react with the photosensitive substance when the latter is exposed to radiation, and subjecting the exposed photographic material to alkaline development using an alkaline developer containing dissolved therein at least one organic compound selected from dyestuffs having the capacity for dyeing tannined cotton and dyestuffs having the capacity for dyeing synthetic fibres.

The carrier base of the photographic material used in the process of this invention can be of any one of a wide variety of materials, for example plastics, paper, cardboard, glass, ceramic material or metal. The size, shape and contours of the surface of the carrier base to which the photosensitive material is to be applied can be selected in accordance with the intended use of the photographic material to be produced. In some cases, it may be necessary for there to be between the carrier base and the photosensitive material, an intermediate layer which does not react with the photosensitive substance when the latter is exposed to radiation and formed, for example, of rubber, lacquer, plastics, metal for example chromium or aluminum, materials used in the production of thin films for optical purposes etc., or a combination of several such layers applied in turn. Depending on the properties thereof, the intermediate layer or layers serve to improve the adhesion of the photosensitive layer to the carrier base and/or the isolation of the photosensitive layer from the carrier base when the latter might otherwise react with the photosensitive substance undergoing exposure and/or to render the carrier base hydrophilic as for example when it is to be used in the production of offset printing plates. The provision of metal intermediate layers will be of particular value when preparing photoresist materials.

The photosensitive layer comprises an inorganic photosensitive substance which, after exposure to radiation, undergoes photoselective dissolution on treatment with an alkaline developer. Such inorganic photosensitive substances may be deposited pure or doped with halogen and will be sulphides, selenides and tellurides of one or more elements selected from phosphorus, arsenic, germanium and certain metals, usually being metals belonging to the groups Ib, IIb, IIIb, IVa and Va of the Periodic Table of the elements, being especially antimony (III), cadmium and bismuth, as in for example antimonous, cadmium and bismuth sulphides. Another preferred material is phosphorous sulphide. The photosensitive materials are preferably amorphous substances, for example arsenous sulphides and mixtures of a number of the aforementioned elements, in particular arsenic, sulphur, germanium and selenium. Examples of these photosensitive materials are set out in the following Table 1 together with typical alkaline developers with which they may be used.

TABLE 1

| No. | Inorganic photosensitive substance | Composition of the alkaline developer |
|---|---|---|
| 1. | $As_{10}Se_{67.5}Ge_{22.5}$ | 0.33N NaOH |
| 2. | $As_2S_5$ | 50 g/l $Na_2CO_3$ |
| 3. | $As_{30}Se_{52.5}Ge_{17.5}$ | 0.33N NaOH |
| 4. | $As_{40}Se_{15}S_{35}Ge_{10}$ | 0.33N NaOH |

TABLE 1-continued

| No. | Inorganic photosensitive substance | Composition of the alkaline developer |
|---|---|---|
| 5. | $Se_{75}Ge_{25}$ | 25% solution of $(CH_3)_2NH$ |
| 6. | $Se_{55}Te_{20}Ge_{25}$ | 25% solution of $(CH_3)_2NH$ |
| 7. | $Se_{60}Sn_{15}Ge_{25}$ | 25% solution of $(CH_3)_2NH$ |
| 8. | $Ge_{17}As_{26}S_{57}$ | 50 g/l $Na_3PO_4$ corrected with $H_3PO_4$ to pH 11.0 |

From the foregoing it will be appreciated that the photosensitive substances are not necessarily simple compounds but may contain the respective elements in other than an exact stoichiometric ratio.

The development of the photographic material in discrete areas to obtain a positive image is carried out using an alkaline developer, that is an aqueous alkaline solution. For this purpose it is possible to employ, for example, salts of strong bases and weak acids, for example lithium, sodium, potassium and ammonium carbonates, phosphates, sulphides, polyphosphates or borates, hydroxide solutions, for example alkaline metal hydroxides and aqueous ammonia, solutions of organic compounds which undergo alkaline reaction, for example aliphatic amines, diamines, polyamines, and quarternary phosphonium oxides.

Both the inorganic photosensitive substance and the alkaline developing agent may contain mixtures of substances as aforementioned.

The organic compounds employed according to the present invention in the developing agent for use with the photographic material in order to improve the properties and photographic characteristics of the photographic material after processing may be selected from two fundamental classes of materials.

Thus, firstly it is possible to employ an organic dyestuff which may be a dyestuff suitable for use in the dyeing of the tannined cotton. Examples of dyestuffs which may be used for this purpose and in the aforementioned photographic materials are xanthine, acridine, azine, oxazine, thiazine, diphenylmethane, triphenylmethane, cyanine and basic azodyes. Secondly, it is possible to employ dyestuffs suitable for use in the dyeing of synthetic fibres, especially polyacrylonitrile and acrylic fibres in general. Dyestuffs of such type are the commercially available dyes known as Basacryls, Sandocryls, Astrazons, Deorlins, Maxilons, Setacyls depending upon the manufacturer thereof. Examples of these various dyes are set out in the following Tables 2 and 3.

TABLE 2

| No. | Organic compound | Structural formula |
|---|---|---|
| 1. | Ethyleosin | (structure shown with Br, KO, O, COOC₂H₅ groups) |

TABLE 2-continued

| No. | Organic compound | Structural formula |
|---|---|---|
| 2. | Alkali blue 6B (C.I. 42765 Acid Blue 119) | (structure shown) |
| 3. | Rosaniline chloride | (structure shown) |
| 4. | Chrysoidine (C.I. 11270 Basic Orange 2) | (structure shown) |
| 5. | Luxol brilliant green BL | Reactive dye with unknown structure; believed to be a derivative of the triphenylmethane dyes |
| 6. | p-Ethoxy-chrysoidine | (structure shown) |

TABLE 3

| No. | Name of dye | Structural formula | C.I. | pH of the alkaline devel. solution |
|---|---|---|---|---|
| 1. | Rhodamine B (Basic Violet 10) | (structure shown) | 45170 | 11.0 |
| 2. | Leather yellow HG (Basic Yellow 9) | (structure shown) | 46040 | 11.0 |
| 3. | Neutral red (Basic Red 5) | (structure shown) | 50040 | 10.5 |
| 4. | Nile blue (Basic Blue 12) | (structure shown) | 51185 | 11.5 |
| 5. | Azur A (Basic Blue 5) | (structure shown) | 42140 | 11.0 |
| 6. | Auramine (Basic Yellow 2) | (structure shown) | 41000 | 11.0 |
| 7. | Soluble blue 6B (Acid Blue 93) | (structure shown) | 42780 | 10.5 |
| 8. | Bismarck brown 6B (Basic Brown 4) | (structure shown) | 21010 | 11.0 |

TABLE 3-continued

| No. | Name of dye | Structural formula | C.I. | pH of the alkaline devel. solution |
|---|---|---|---|---|
| 9. | Flavaniline (Basic Dye) | 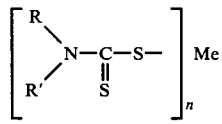 | 47025* | 11.0 |
| 10. | Procion brilliant blue M5BS | 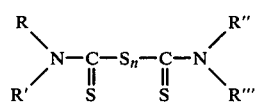 | | 10.5 |
| 11. | Basacryl red XBL (Basic Red 29) | Cationic basic dye of BASF - BRD | S163 | 11.0 |
| 12. | Sandocryl gold yellow BRLE | Cationic dye of Sandoz - Switzerland | | 11.5 |
| 13. | Remacryl orange RRL | Cationic dye of Hoechst, BRD | | 11.0 |
| 14. | Astrazon red RL | Cationic dye of FBy - BRD | | 11.0 |
| 15. | Deorlin light blue R1 | Cationic dye of CIBA - Switzerland | | 11.5 |
| 16. | Maxilon blue 5G | Cationic dye of CIBA - Switzerland | | 11.5 |

*C.I. - Society of Dyers and Colourists, British Colour Index, Rowe F.M. (ed.) 2nd Ed., Bradford, 1956. Suppl. 1963.

It is also possible when carrying out the process of this invention to include in the photographic material organic compounds which are used in the vulcanization of elastomers as accelerators, antioxidants or age resistors. Examples of these compounds are the following:

1. dithiocarbamates and derivatives thereof having e.g. the general formula

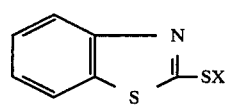   I wherein R, and R' are hydrocarbyl radicals, especially alkyl or aryl, Me denotes a metal or amino group and n denotes the valency of the metal or amino group;

2. thiuramsulphides and derivatives thereof having e.g. the general formula $$\begin{array}{c}R\\ \diagdown\\ R'\end{array}N-\underset{\underset{S}{\|}}{C}-S_n-\underset{\underset{S}{\|}}{C}-N\begin{array}{c}\diagup R''\\ \\ \diagdown R'''\end{array} \quad \text{II}$$

wherein R, R', R" and R''' are hydrocarbyl radicals, especially alkyl or aryl and n denotes an integer from 1 to 4;

3. thiazoles and derivatives thereof having e.g. the general formula

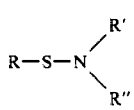   III wherein x denotes hydrogen, a metal atom or an organic radical;

4. sulphonamides and derivatives thereof having e.g. the general formula $$R-S-N\begin{array}{c}\diagup R'\\ \diagdown R''\end{array} \quad \text{IV}$$

wherein R denotes a thiazolyl or benzthiazolyl radical, or a residue of a carbamic acid or a heterocyclic compound and R' and R" denote hydrocarbyl radicals, especially alkyl or aryl radicals;

5. guanidines having e.g. the general formula $$R-NH-\underset{\underset{NH}{\|}}{C}-NH-R' \quad \text{V}$$

wherein R and R' denote hydrocarbyl radicals especially aryl radicals;

6. aldamines having e.g. the general formula;

$$R-N=CH-R' \quad \text{VI}$$

wherein R denotes a hydrocarbyl group, especially an alkyl or aryl radical and R'—CH= denotes the residue of an aldehyde; and 7. a heterocyclic five-membered ring-containing compound in which the ring contains from 1 to 4 heteroatoms and sulphonated derivatives and sulphydryl (mercapto) derivatives thereof.

Also includable in the photographic material to enhance the antiageing action achieved with the dyestuffs used according to the process of this invention are organic compounds effective in the development of silver halide-based photographic materials, for example methol, hydroquinone, amidol, para-aminophenol and paraphenylenediamine.

Examples of these organic compounds which may be incorporated in the photographic material are set out in the following Table 4.

quently by drying of the liquid film. A colloidal solution utilised for the last identified purpose can additionally contain a high molecular compound, for example gelatin, polyvinylalcohol or polyvinylpyrrolidone, which after drying of the coated liquid layer forms a photographic emulsion.

TABLE 4

| No. | Organic compound | Structural formula | Typical Doping concentration weight % |
|-----|------------------|--------------------|---------------------------------------|
| 1. | Telluric diethyldithiocarbamate | $[(C_2H_5)_2N-\underset{\underset{S}{\parallel}}{C}-S]_4 Te$ | 1.5 |
| 2. | Tetramethylthiurammonosulphide | $(CH_3)_2N-\underset{\underset{S}{\parallel}}{C}-S-\underset{\underset{S}{\parallel}}{C}-N(CH_3)_2$ | 0.3 |
| 3. | Altax dibenzothiazoledisulphide | (benzothiazole)-C-S-S-C-(benzothiazole) | 0.5 |
| 4. | Vulcacite C | (benzothiazole)-C-S-NH-HC(CH$_2$-CH$_2$)$_2$CH$_2$ (cyclohexyl) | 0.7 |
| 5. | N,N'—diphenylguanidine | $C_6H_5-NH-\underset{\underset{NH}{\parallel}}{C}-C_6H_5$ | 1.1 |
| 6. | Accelerant T | | 1.2 |
| 7. | Mercaptobenzimidazole | $C_6H_4\underset{NH}{\overset{N}{\diagup\diagdown}}C-SH$ | 1.0 |
| 8. | Phenylmercaptotetrazole | $C_6H_5-N-C-SH$ tetrazole ring | 1.0 |
| 9. | Methol | OH—C$_6$H$_4$—NHCH$_3$ | 0.8 |
| 10. | 1-phenyl-4-amino-5-pyrazolone | H$_2$N— pyrazolone —C$_6$H$_5$ | 0.9 |

In producing the aforementioned photographic materials, the photosensitive layer is generally deposited in a thickness of from 0.01–10 μm on the carrier base by any of the methods known for this purpose, for example, evaporation or sputtering in a vacuum of the inorganic photosensitive substance or substances.

It is possible to carry out the simultaneous evaporation of one or more pre-prepared compounds and/or of the individual elements thereof which combine on the substrate. As an alternative to employing such a method, it is also possible to deposit the photosensitive layer by centrifugation of a powder, compaction or by spreading thereover a solution or suspension of one or more inorganic photosensitive substances in a suitable liquid medium, for example water, followed subse- The organic compounds to be included in the photographic material may be introduced into the whole or part of the volume of the photosensitive layer in an overall concentration of from 0.1 to 20% by weight. Alternatively, the photosensitive compound may be applied in several stages separated by the application to the then applied photosensitive layer of the organic compounds. The organic compounds may also be applied to the surface of the photosensitive layer. Organic compounds applied in such manner as discrete layers thereof may be applied in monomolecular coatings in an amount of up to $10^{-2}$ g/cm$^2$. It will therefore be appreciated that different organic compounds as aforesaid may be incorporated in the photographic material either simultaneously or through the aforementioned variants in the doping, use of intermediate films or use of surface films on the photosensitive layer contemplated in the foregoing.

The introduction of such organic compound or combinations thereof in the whole or part of the volume of the finished photosensitive layer can be achieved by evaporation thereof in vacuum and condensation of vapours thereof together with the vapours of the inorganic photosensitive substance. Such organic compounds can also be deposited at a time when deposition of the inorganic photosensitive substance is not taking place as one or more intermediate films at different depths in the photosensitive layer and/or on its surface. Deposition of the organic compounds on the surface of the photosensitive layer or as an intermediate film can also be achieved by dipping the then produced photographic material in a solution of the relevant organic compound for from 10–300 seconds or by applying the organic compound to the surface of the photographic material from a solution thereof by centrifugation, powdering, or by spreading or coating of a solution of the organic compound and subsequently drying the photographic material.

When the photosensitive layer is coated onto the carrier base in the form of a solution or suspension, the organic compound may be added to the solution or suspension prior to application thereof onto the carrier base.

The aforementioned dyestuffs which are applied to the photographic material from the alkaline developing agent at the time of developing the latent positive image produced on the photographic material may be added directly to the alkaline developing agent or in the form of a solution in a solvent, for example water, or an organic solvent, for example an alcohol, ketone, ester or mixtures thereof miscible with the alkaline developing agent. They are generally present in the developing agent in a concentration of from $10^{-2}$ g/l up to the maximum quantity soluble at the working temperature of the developer. The type and quantity of the solvent present in the alkaline developing agent influences strongly the efficiency of the dyestuffs. Thus, the addition of alcohols, ketones or esters, or mixtures thereof, to the alkaline developing agent may also be effected when working with water-soluble dyestuffs or when they have been introduced previously into the photosensitive layer in order to influence the efficiency of the dyestuffs.

In preparing a photographic system for use in the process of this invention, the preparation and optimization of the photographic system from the point of view of quality and photographic characteristics will depend on the type of substrate used, the composition of the photosensitive layer and the manner of its preparation, the nature and quantity of the organic compound or compounds added, the pH of the alkaline developer, the type and quantity of the organic solvent incorporated therein and the type and concentration of the alkaline substance present in the developing agent.

A photographic material produced by the process of this invention has been found to possess the following characteristic advantages:

1. High photographic sensitivity which is from 10 to 20 times higher than the sensitivity of hitherto described photographic materials for use in photolithography comprising photosensitive inorganic substances, the photographic sensitivity is of the order of the sensitivity of the organic photolacquers hitherto widely used in photolithographic practice;

2. Non-critical alkaline development which will have permitted variations by from 20–25%, in some cases up to 50%, in development time without leading to inadmissible changes of detail on the image produced on the photographic material, thus enabling accurate reproduction of a subject over the whole area of the photographic material;

3. A shelf life more than six months.

In addition to these advantages, the photographic materials possess the characteristic advantages of the inorganic photosensitive systems of the type referred to herein, compared to the organic photolacquers hitherto widely used in photolithographic practice:

4. Exceptionally high resolving power; the possibility of achieving deposition of the photosensitive layer by evaporation or sputtering in a vacuum, thereby achieving excellent uniformity and enabling preparation to be carried out under very clean conditions and in which entry of impurities into the product is substantially avoided;

5. Very good adhesion to the carrier base allowing the etching of the substrate or of an intermediate layer to be carried out safely; multilayer materials containing photosensitive and other inorganic substances may be employed; easy removal of the photosensitive layer, both in respect of exposed and unexposed areas.

The following non-limiting Examples illustrate the invention:

EXAMPLE 1

Chromium with an optical density above 2 was deposited onto a polished and washed glass substrate under a vacuum better than $10^{-5}$ Torr. Using the same vacuum cycle, a 0.1 μm thick photosensitive layer was deposited as follows:

Arsenous sulphide was evaporated from a suitable crucible and deposited at a condensation rate of 1 A per sec. Simultaneously, Thiuram D, Mercazine I and hydroquinone previously mixed together in equal quantities and pressed into a pellet were evaporated from another crucible so that the photosensitive layer was doped throughout with these materials in an amount of 0.5% by weight. The chromium photographic plates thus produced were exposed to white light through an emulsion photomask. Development was then carried out for three to four minutes in an aqueous solution containing 10 g/l sodium hydroxide (acidified with concentrated nitric acid to pH 11.0) and 2 g/l Nile blue (C.I.51185—Basic Blue 12). The plates were then thoroughly washed in water, the chromium was etched and the remaining photosensitive layer was removed by immersion for 5–10 secs. in a 5–10% by weight aqueous solution of sodium hydroxide.

EXAMPLE 2

Chromium photoplates were produced in the manner described in Example 1. They were then exposed in the manner described in Example 1 and were developed in a developing agent prepared in the following manner:

15 g potassium hydroxide were added to 900 ml water and the pH of the solution was adjusted to 11.0 with concentrated sulphuric acid. 2 g Cryptocyanine were dissolved in 100 ml ethyl alcohol and this alcoholic solution was added to the aqueous developing agent with intensive stirring. Development was carried out for 3 to 4 minutes. The developed photographic plates were then washed thoroughly in water, the chromium was etched and the remaining photosensitive layer was removed in the manner described in Example 1.

EXAMPLE 3

Chromium photographic plates were prepared in the manner described in Example 1. They were exposed in the manner described in Example 1 and then developed for 3 to 4 minutes in a developing agent having the composition given in Example 1 corrected to pH 11.0 and to which were added 4 g/l Acridine orange (C.I. 46005—Basic orange 14), 0.5 g/l Safranine 0 (C.I. 50240-Basic Red 2), 0.1 g/l Methylene blue (C.I. 52015—Basic Blue 9) and 2 g/l Erythrosine (C.I. 45430—Acid Red 51). The operations described in Example 1 were then carried out until the final chromium pattern was produced.

EXAMPLE 4

A photosensitive layer of arsenous sulphide was vapour deposited under a vacuum better than $10^{-5}$ Torr onto an anodised aluminum offset plate in a thickness of 0.1 $\mu$m at a rate of deposition of 10 A per sec. The plate was exposed to a mask on a copying frame and was developed in a solution produced by adding 75 g sodium carbonate, 0.2 g Pyronine Y (C.I. 45005* Basic Dye) to 1 liter water. Development was carried out for about 100 sec. by wiping the plate with a cotton pad soaked with the developing solution in some experiments and by dipping in a bath or a developing unit in other experiments. The plates were then washed under running water and subjected to hydrophilisation by immersion in an aqueous solution of phosphoric acid in a concentration of 50 ml/l. After second washing in water, inking and gumming with gum arabic, the plates were ready for printing.

COMPARATIVE EXAMPLE

The procedure of Example 4 was repeated with plates being produced in the manner described in Example 4 and developed in the same alkaline developing agent before the omission of the Pyronine Y (C.I. 45005* Basic Dye) therefrom. At equal sensitivities, this absence of the dye from the developing agent led to a higher critical response in respect of the time of development (10-15 secs) as compared with the developing time when Pyronine Y (C.I. 45005* Basic Dye) was present in the alkaline developing agent (70-140 sec).

EXAMPLES 5 TO 10

The procedure of Example 4 was repeated but using in place of the arsenous sulphide in Examples 5 to 10, the inorganic photosensitive substances 1 to 5 respectively set out in Table 5. The plates produced were exposed to a mask for a suitable time on a copying frame and developed for 1 to 2 minutes in the manner described in Example 2 but using developing solutions differing from that used in Example 4 in respect of the basic component thereof as indicated in Table 5. The procedure described in Example 2 was continued until a ready offset plate was produced in each case.

TABLE 5

| No. | Inorganic photosensitive substance | Composition of the alkaline developer |
|---|---|---|
| 1. | $P_2Se_3$ | 16% solution of $(CH_3)_2NH$ |
| 2. | $As_2Se_7$ | 4% solution of $(CH_3)_2NH$ |

TABLE 5-continued

| No. | Inorganic photosensitive substance | Composition of the alkaline developer |
|---|---|---|
| 3. | $As_2SE_3$ | 33% solution of $(CH_3)_2NH$ |
| 4. | $P_{20}Se_{60}Ge_{20}$ | 10% solution of $(CH_3)_2NH$ |
| 5. | $As_2S_3I_{1.2}$ | 2.3 g/l of $Na_2CO_3$ |

EXAMPLE 11

A photographic emulsion prepared in the manner described in Bulgarian Authorship Certificate 27331 was applied to a carrier base and exposed by means of a laser having a wave-length of 488 nm and a sinusoidal distribution of light intensity after which it was developed for 1-2 minutes in the alkaline developing solution used in Example 1. After thoroughly washing the developed emulsion in water to achieve complete removal of the dye and drying the resulting product, a ready phase grid was obtained.

We claim:

1. A process for the production of a photographic material for use in photolithography, which comprises exposing imagewise to radiation a material which comprises a carrier base and, on the carrier base, a thin homogeneous or emulsion layer of at least one photosensitive substance selected from chalcogenides of phosphorus, arsenic, germanium and metals, which photosensitive substance is capable, upon exposure to radiation, of exhibiting photoselective capacity for dissolution in an alkaline developer, the photosensitive substance being either unreactive with the carrier base when exposed to radiation or reactive with the carrier base when exposed to radiation and isolated from the carrier base by interposition between the said layer and the carrier base of an intermediate layer having adhesive and/or insulating and/or hydrophilic properties and which does not react with the photosensitive substance when the latter is exposed to radiation, and subjecting the exposed photographic material to alkaline development using an alkaline developer containing dissolved therein at least one organic compound selected from dyestuffs having the capacity for dyeing tannined cotton and dyestuffs having the capacity for dyeing synthetic fibres.

2. A process as claimed in claim 1, wherein the carrier base or a said intermediate layer on which the photosensitive layer has been deposited is formed of an acid etchable metal.

3. A process as claimed in claim 2, wherein said metal is chromium or aluminum.

4. A process as claimed in claim 1, wherein the photosensitive substance is unreactive with the carrier base and is isolated from the carrier base by interposition between the said layer and the carrier base of an intermediate layer having adhesive and/or insulating and/or hydrophilic properties and which does not react with the photosensitive substance.

5. A process as claimed in claim 4, wherein the carrier base is formed of a material selected from a group consisting of plastics, paper, cardboard, glass and ceramic material.

6. A process as claimed in claim 5, wherein said intermediate layer is formed of an acid etchable metal.

7. A process as claimed in claim 6, wherein said metal is chromium or aluminum.

8. A process as claimed in claim 1, wherein the organic compound is a dyestuff effective in the dyeing of polyacrylonitrile and acrylic fibres.

9. A process as claimed in claim 1, wherein said material which is exposed imagewise to radiation additionally contains at least one organic compound selected from compounds capable of acting as accelerators, antioxidants or age resistors in the vulcanization of elastomers and developing agents effective in the development of silver halide-based photographic materials.

10. A process according to claim 1, wherein the alkaline developer contains one or more said dyestuffs in a concentration ranging from $10^{-2}$ g/l to the saturation concentration at the working temperature of the alkaline developer.

11. A process according to claim 1, wherein the dyestuff having the capacity for dyeing cotton is xanthine, acridine, azine, thiazine, diphenylmethane or triphenylmethane dye, a basic azo dye or a cyanine dye.

12. A process according to claim 1, wherein the organic compound(s) has been incorporated in the alkaline developer as such or in the form of a solution in water or an organic solvent.

13. A process as claimed in claim 12, wherein the organic solvent is selected from the group consisting of alcohols, ketones, esters and mixtures thereof.

14. A process as claimed in claim 3, wherein the aluminum is anodised.

* * * * *